(12) United States Patent
Yamauchi et al.

(10) Patent No.: US 11,081,858 B2
(45) Date of Patent: Aug. 3, 2021

(54) OPTICAL TRANSMITTER MODULE, OPTICAL MODULE, OPTICAL TRANSMISSION EQUIPMENT AND METHOD OF MANUFACTURING THEREOF

(71) Applicant: Lumentum Japan, Inc., Kanagawa (JP)

(72) Inventors: Shunya Yamauchi, Kanagawa (JP); Yoshihiro Nakai, Kanagawa (JP); Takayuki Nakajima, Tokyo (JP); Masahiro Ebisu, Tokyo (JP)

(73) Assignee: Lumentum Japan, Inc., Kanagawa (JP)

( * ) Notice: Subject to any disclaimer, the term of this patent is extended or adjusted under 35 U.S.C. 154(b) by 179 days.

(21) Appl. No.: 15/928,229

(22) Filed: Mar. 22, 2018

(65) Prior Publication Data
US 2018/0278019 A1 Sep. 27, 2018

(30) Foreign Application Priority Data
Mar. 24, 2017 (JP) .............................. JP2017-059048

(51) Int. Cl.
*H01S 5/024* (2006.01)
*H01S 5/06* (2006.01)
*H01S 5/068* (2006.01)
*H01S 5/026* (2006.01)
*H01S 5/042* (2006.01)
(Continued)

(52) U.S. Cl.
CPC ............ *H01S 5/0612* (2013.01); *H01S 5/023* (2021.01); *H01S 5/026* (2013.01); *H01S 5/0233* (2021.01); *H01S 5/0235* (2021.01); *H01S 5/02415* (2013.01); *H01S 5/02476* (2013.01); *H01S 5/042* (2013.01); *H01S 5/068* (2013.01); *H01S 5/0265* (2013.01); *H01S 5/02216* (2013.01); *H01S 5/02251* (2021.01); *H01S 5/02325* (2021.01); *H01S 5/02345* (2021.01);
(Continued)

(58) Field of Classification Search
None
See application file for complete search history.

(56) References Cited

U.S. PATENT DOCUMENTS 6,234,404 B1 * 5/2001 Cooke .................... F02M 47/00
239/533.9
6,327,289 B1 * 12/2001 Kitaoka ............. G02B 6/12004
372/34
(Continued)

FOREIGN PATENT DOCUMENTS

CN 104518423 A 4/2015
JP S63318188 A 12/1988
(Continued)

*Primary Examiner* — Tod T Van Roy
(74) *Attorney, Agent, or Firm* — Harrity & Harrity, LLP

(57) ABSTRACT

An optical transmitter module includes optical semiconductor devices including a first optical semiconductor device, a temperature adjustment means for collectively performing temperature adjustment on the optical semiconductor devices, and a first thermal resistor that is disposed between the first optical semiconductor device and the temperature adjustment means, in which, when the temperature adjustment means is driven, the temperature of the first optical semiconductor device is higher than temperatures of other optical semiconductor devices which are different from the first optical semiconductor device.

15 Claims, 8 Drawing Sheets

(51) Int. Cl.
*H01S 5/023* (2021.01)
*H01S 5/0233* (2021.01)
*H01S 5/0235* (2021.01)
*H04B 10/40* (2013.01)
*H01S 5/12* (2021.01)
*H01S 5/40* (2006.01)
*H01S 5/02216* (2021.01)
*H01S 5/02251* (2021.01)
*H01S 5/02325* (2021.01)
*H01S 5/02345* (2021.01)

(52) U.S. Cl.
CPC .............. *H01S 5/02484* (2013.01); *H01S 5/12* (2013.01); *H01S 5/4087* (2013.01); *H04B 10/40* (2013.01)

(56) References Cited

U.S. PATENT DOCUMENTS

| | | | | |
|---|---|---|---|---|
| 6,829,264 | B2* | 12/2004 | Deacon | H01S 5/024 372/34 |
| 2004/0141538 | A1* | 7/2004 | Schmid | H01S 5/18372 372/70 |
| 2008/0123705 | A1* | 5/2008 | Schleuning | H01S 5/024 372/36 |
| 2008/0192206 | A1* | 8/2008 | Takagi | H01S 5/4062 353/28 |
| 2009/0279578 | A1* | 11/2009 | Pan | H01S 5/02252 372/50.121 |
| 2010/0220755 | A1 | 9/2010 | Frank et al. | |
| 2014/0126917 | A1 | 5/2014 | Sato | |
| 2016/0099543 | A1* | 4/2016 | Kuramoto | H01S 5/022 372/36 |
| 2016/0254639 | A1* | 9/2016 | Watanabe | H01S 5/024 372/36 |
| 2019/0386455 | A1* | 12/2019 | Nagahara | H01S 5/06817 |
| 2020/0044414 | A1* | 2/2020 | Funada | H04B 10/506 |

FOREIGN PATENT DOCUMENTS

| | | |
|---|---|---|
| JP | 2003078088 A | 3/2003 |
| JP | 2009064829 A | 3/2009 |
| JP | 2013115257 A | 6/2013 |
| JP | 2013-153136 A | 8/2013 |
| JP | 2014022567 A | 2/2014 |
| WO | 2015063973 A1 | 5/2015 |

* cited by examiner

FIG.5

TABLE 1 TEMPERATURE DIFFERENCE IN CASE OF 600*300*100um

| MATERIAL | SYMBOL | HEAT CONDUCTIVITY (W/mK) | TEMPERATURE DIFFERENCE(K) | CONVERTED WAVELENGTH DIFFERENCE OF LD DEVICE OSCILLATION |
|---|---|---|---|---|
| ALUMINUM NITRIDE | AlN | 150 | 0.42 | 0.03 |
| SAPPHIRE | Al2O3 | 41 | 1.54 | 0.12 |
| ALUMINA | Al2O3 | 32 | 1.97 | 0.16 |
| SILICON NITRIDE | Si3N4 | 27 | 2.34 | 0.19 |
| CERMET | TiC·TiN | 17 | 3.72 | 0.30 |
| YTTRIA | Y2O3 | 14 | 4.51 | 0.36 |
| MULLITE | 3Al2O3·2SiO2 | 5 | 12.64 | 1.01 |
| ZIRCONIA | ZrO2 | 3 | 21.06 | 1.69 |

# OPTICAL TRANSMITTER MODULE, OPTICAL MODULE, OPTICAL TRANSMISSION EQUIPMENT AND METHOD OF MANUFACTURING THEREOF

CROSS-REFERENCE TO RELATED APPLICATION

The present application claims priority from Japanese application JP2017-059048, filed on Mar. 24, 2017, the content of which is hereby incorporated by reference into this application.

BACKGROUND OF THE INVENTION

1. Field of the Invention

The present invention relates to an optical transmitter module provided, an optical module, optical transmission equipment with a plurality of optical semiconductor devices, and a method for manufacturing the same, and particularly to temperature adjustment of the plurality of optical semiconductor devices.

2. Description of the Related Art

An optical transmitter module provided with a plurality of optical semiconductor devices is used. For example, an optical transmitter module further includes a submount and a Peltier element. The plurality of optical semiconductor devices is disposed on an upper surface (mounting surface) of the submount, and the Peltier element is disposed on a lower surface (bottom surface) of the submount. The plurality of optical semiconductor devices and the Peltier element are thermally connected to each other via the submount. A single Peltier element is used to adjust temperatures of the plurality of optical semiconductor devices.

JP2013-153136A discloses a transmitter optical subassembly (TOSA) based on wavelength division multiplexing (WDM), including a plurality of semiconductor lasers and a Peltier element, and temperatures are collectively controlled by using a single Peltier element via the submount.

SUMMARY OF THE INVENTION

In an optical transmitter module of the related art, respective temperatures of semiconductor lasers are collectively adjusted by using a single Peltier element so as to fall within a desired temperature range. Generally, a large number of semiconductor lasers are collectively manufactured on a semiconductor wafer, and then it is tested whether the respective output wavelengths of light beams emitted from the large number of semiconductor lasers at a reference temperature (for example, 50° C.) fall within a reference wavelength range. However, it is hard that the respective output wavelengths of all (or most) of a large number of semiconductor lasers manufactured on the semiconductor wafer fall within the reference wavelength range. Thus, some of the manufactured semiconductor lasers may emit light beams with the respective output wavelengths which do not fall within the reference wavelength range. For example, in an optical transmitter module, where temperatures of semiconductor lasers are adjusted to a reference temperature (a predefined temperature range including the reference temperature) by using a Peltier element, and then subject to a test whether all semiconductor lasers emit light beams with their respective output wavelengths which fall within a reference wavelength range. The semiconductor lasers which pass the test, and are mounted on a submount.

Generally, an output wavelength of a light beam emitted from a semiconductor laser depends on temperature of the semiconductor laser. Therefore, where temperatures of semiconductor lasers are collectively adjusted by using a Peltier element, the semiconductor lasers which do not pass the test have to be discarded. As a result, yield of the semiconductor lasers is reduced, and thus cost of the semiconductor lasers is increased. In contrast, where temperatures of the semiconductor lasers are separately adjusted, even the temperatures of the discarded semiconductor lasers can also be adjusted to an appropriate temperature, and thus output wavelengths of the discarded semiconductor lasers can be made to fall within a predefined wavelength range including the appropriate temperature. However, in this case, a each of the semiconductor lasers requires a corresponding temperature adjustment mechanism such as a Peltier element, and thus drive circuits and the like driving the respective temperature adjustment mechanisms hinder miniaturization or achievement of low cost of the optical transmitter module.

The present invention has been made in light of the problems, and an object of the present invention is to provide an optical transmitter module, an optical module, and an optical transmission equipment comprising optical semiconductor devices, and a method of manufacturing of the same, capable of realizing low cost, miniaturization, and adjustment of the temperature of each of the optical semiconductor devices.

(1) In order to solve the problem, according to the present invention, there is provided an optical transmitter module including optical semiconductor devices, comprising a first optical semiconductor device; a temperature adjustment means for collectively performing temperature adjustment on the optical semiconductor devices; and a first thermal resistor that is disposed between the first optical semiconductor device and the temperature adjustment means, in which, when the temperature adjustment means is driven, the temperature adjustment means causes the temperature of the first optical semiconductor device to be higher than temperatures of other optical semiconductor devices of the optical semiconductor device.

(2) In the optical transmitter module according to (1), the first optical semiconductor device may emit one light beam with a first wavelength which is different from a first predefined wavelength at a driving temperature which is controlled by the temperature adjustment means, and, when the temperature adjustment means is driven, the first thermal resistor shifts a wavelength of other light beam emitted from the first optical semiconductor device from the first wavelength closer to the first predefined wavelength.

(3) The optical transmitter module according to (1) or (2) may further include a submount, on which the optical semiconductor devices are mounted, arranged to thermally connect to the temperature adjustment means, and the first thermal resistor may be a first sub-substrate disposed between the first optical semiconductor device and the submount in thermal communication with the first optical semiconductor device and the submount.

(4) In the optical transmitter module according to (3), a second optical semiconductor device of the optical semiconductor devices which is different from the first optical semiconductor device may be directly mounted on the submount.

(5) The optical transmitter module according to (3) may further include a second sub-substrate, disposed between a second optical semiconductor device and the submount in thermal communication with the second optical semiconductor device and the submount, configured to cause the temperature of the second optical semiconductor device to be different from the temperature of the first optical semiconductor device when the temperature adjustment means is driven, and the second optical semiconductor device is different from the first optical semiconductor device.

(6) In the optical transmitter module according to (5), the second optical semiconductor device may emit one light beam with a second wavelength which is different from a second predefined wavelength in a temperature range controlled by the temperature adjustment means, and, when the temperature adjustment means is driven, the second sub-substrate shifts a wavelength of other light beam emitted from the second optical semiconductor device from the second wavelength closer to the predefined wavelength.

(7) The optical transmitter module according to (3) may further include sub-substrates, each disposed between a corresponding optical semiconductor device of the optical semiconductor devices and the submount in thermal communication with the corresponding optical semiconductor devices and the submount, configured to cause temperatures of at least two of the optical semiconductor devices to be different from each other when the temperature adjustment means is driven.

(8) In the optical transmitter module according to (7), thicknesses of the sub-substrates may be substantially the same.

(9) In the optical transmitter module according to (5) or (6), thermal resistance of the first sub-substrate between the submount and the first optical semiconductor device may be different from thermal resistance of the second sub-substrate between the submount and the second optical semiconductor device.

(10) In the optical transmitter module according to any one of (3) to (9), heat conductivity of a material forming the first sub-substrate may be lower than heat conductivity of a material forming the submount.

(11) In the optical transmitter module according to (1) or (2), the first thermal resistor may be a first sub-substrate directly mounted on the temperature adjustment means, the first optical semiconductor device may be directly mounted on the first sub-substrate, and, a second optical semiconductor device of the optical semiconductor devices which is different from the first optical semiconductor device may be directly mounted on the temperature adjustment means.

(12) The optical transmitter module according to (1) or (2) may further include a second sub-substrate, the first thermal resistor may be a first sub-substrate directly mounted on the temperature adjustment means, the first optical semiconductor device may be directly mounted on the first sub-substrate, the second optical semiconductor device may be directly mounted on the temperature adjustment means, the second sub-substrate may be directly mounted on the second sub-substrate, and, when the temperature adjustment means is driven, the temperature adjustment means may cause the temperatures of the first optical semiconductor device and the second optical semiconductor device to be different from each other.

(13) According to the present invention, there is provided an optical module including the optical transmitter module according to any one of the above (1) to (12); and an optical receiver module.

(14) According to the present invention, there is provided optical transmission equipment mounted with the optical module according to the above (13).

(15) According to the present invention, there is provided a method of manufacturing an optical transmitter module including optical semiconductor devices, a temperature adjustment means for collectively performing temperature adjustment on the optical semiconductor devices, and a first thermal resistor that is disposed between a first optical semiconductor device of the optical semiconductor devices and the temperature adjustment means, the method comprising: manufacturing the first optical semiconductor device; measuring an output wavelength of a light beam emitted from the first optical semiconductor device at a reference temperature; comparing the output wavelength with a reference wavelength range corresponding to the first optical semiconductor device so as to obtain a wavelength difference; and determining a material and dimensions of the first thermal resistor on the basis of the wavelength difference.

According to the present invention, it is possible to provide an optical transmitter module, an optical module, an optical transmission equipment, and a method of manufacturing thereof, capable of realizing low cost, miniaturization, and adjustment of the temperature of each of a plurality of optical semiconductor devices.

BRIEF DESCRIPTION OF THE DRAWINGS

FIG. 5 is a diagram illustrating characteristics of a thermal resistor for ceramic materials.

DETAILED DESCRIPTION OF THE INVENTION

Figure 1:
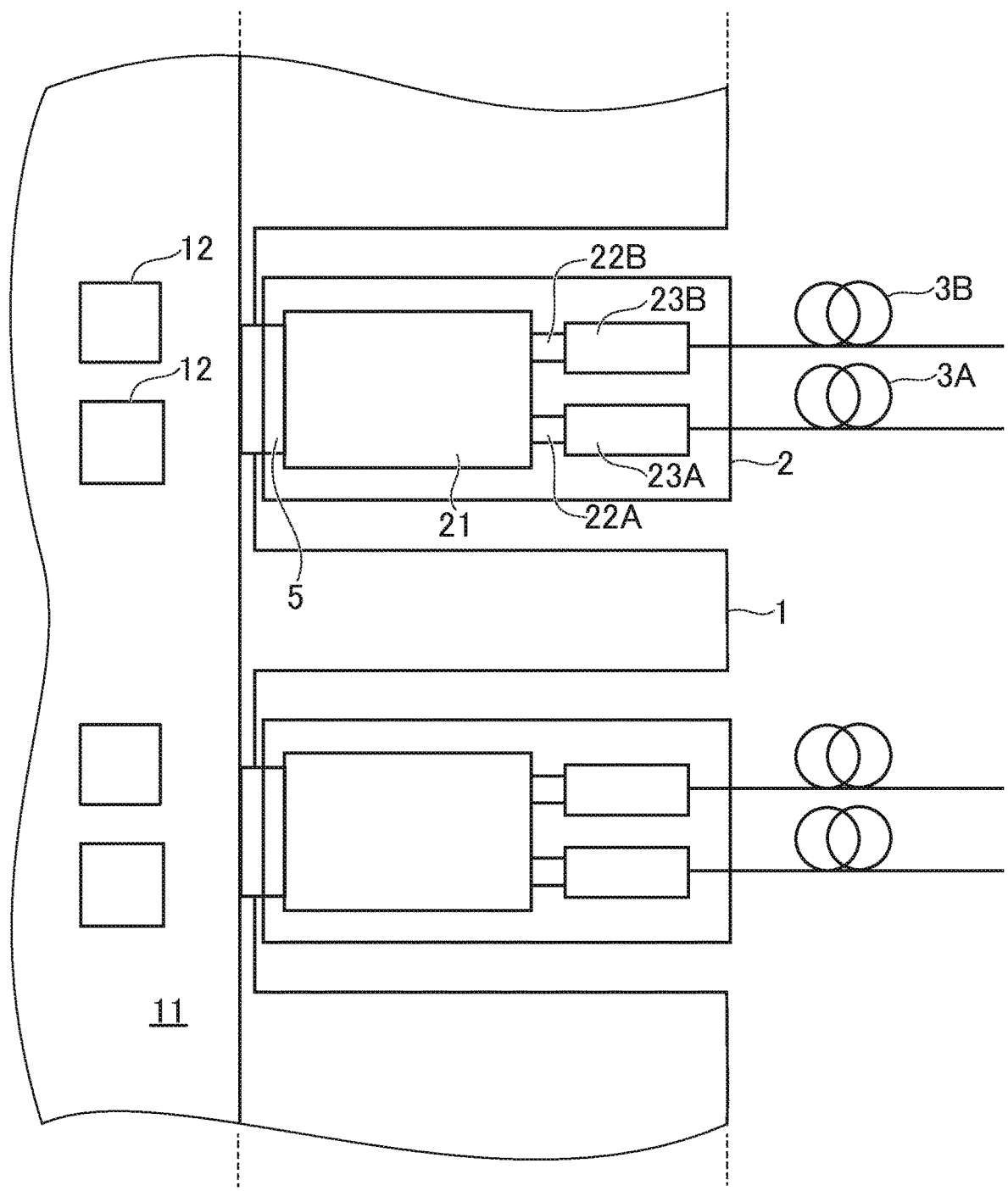
FIG. 1 is a schematic diagram illustrating optical transmission equipment and an optical module according to a first embodiment of the present invention.

Hereinafter, embodiments of the present invention will be described in detail with reference to the drawings. A member having the same configuration is given the same reference numeral throughout the drawings for explaining the embodiments, and a repeated description will not be made. The following drawings are used to merely describe Examples of the embodiments, and a size of each of the drawings does not necessarily match a scale described in the Example.

First Embodiment

FIG. 1 is a schematic diagram illustrating an optical transmission equipment 1 and an optical module 2 according to a first embodiment of the present invention. The optical transmission equipment 1 includes a printed circuit board 11 and ICs 12. The optical transmission equipment 1 is, for example, a router or a switch with large capacity. The optical transmission equipment 1 functions as, for example, a switch, and is disposed in a base station or the like. The optical transmission equipment 1 is mounted with a plurality of optical modules 2, acquires reception data (reception electric signal) from the optical module 2, determines what kind of data is to be transmitted to any one of the optical modules by using the ICs 12 or the like, generates transmission data (transmission electric signal), and delivers the data to the corresponding optical module 2 via the printed circuit board 11.

The optical module 2 is a transceiver having a function of the optical transmitting and a function of the optical receiving. The optical module 2 includes a printed circuit board 21, an optical receiver module 23A which converts an optical signal which is received via an optical fiber 3A into an electric signal, and an optical transmitter module 23B which converts an electric signal into an optical signal which is then transmitted to an optical fiber 3B. The printed circuit board 21, and the optical receiver module 23A and the optical transmitter module 23B are connected to each other via flexible printed circuit boards 22A and 22B, respectively. An electric signal from the optical receiver module 23A is transmitted to the printed circuit board 21 via the flexible printed circuit board 22A, and an electric signal from the printed circuit board 21 is transmitted to the optical transmitter module 23B via the flexible printed circuit board 22B. The optical module 2 and the optical transmission equipment 1 are connected to each other via an electric port 5. The optical receiver module 23A and the optical transmitter module 23B are electrically connected to the printed circuit board 21, and respectively convert an optical signal and an electric signal into an electric signal and an optical signal.

A transmission system according to the present embodiment includes two or more optical transmission equipments 1, two or more optical modules 2, and one or more optical fibers 3 (for example, the optical fibers 3A and 3B). Each optical transmission equipment 1 is connected to one or more optical modules 2. The optical modules 2 respectively connected to two optical transmission equipments 1 are connected to each other via the optical fibers 3. Transmission data generated by one optical transmission equipment 1 is converted into an optical signal by the optical module 2 connected thereto, and the optical signal is transmitted to the optical fibers 3. The optical signal transmitted on the optical fibers 3 is received by the optical module 2 connected to the other optical transmission equipment 1, the optical module 2 converts the optical signal into an electric signal, and the electric signal is transmitted to the other optical transmission equipment 1 as reception data.

Here, a bit rate of electric signals transmitted from and received by each optical module 2 is 100 Gbit/s. The optical transmitter module 23B is a module based on a CFP system standard, and performs dense wavelength division multiplexing (DWDM) in which light at 25 Gbit/s (or 28 Gbit/s) is multiplexed with four wavelengths at a wavelength interval of 20 nm, and is thus transmitted at 100 Gbit/s.

Figure 2:
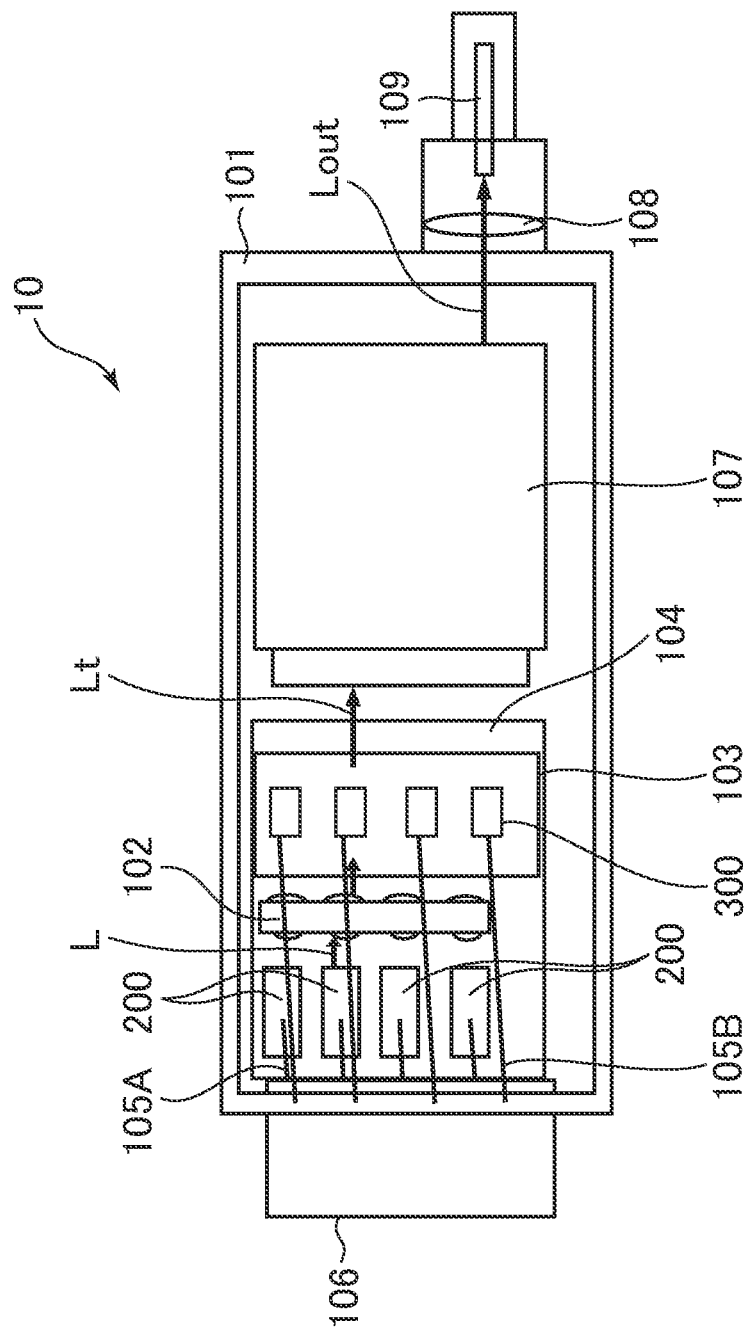
FIG. 2 is a diagram illustrating a plan view of the inside of an optical transmitter module according to the first embodiment of the present invention.
Figure 3:
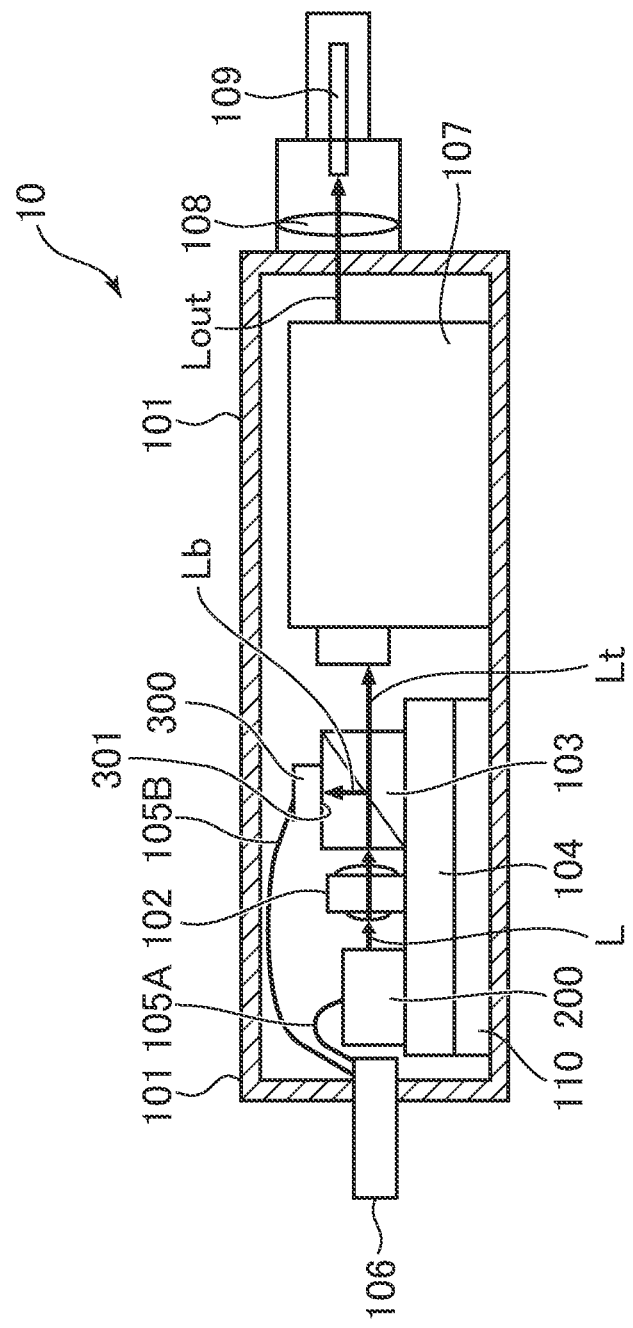
FIG. 3 is a cross sectional view of the optical transmitter module according to the first embodiment of the present invention.

FIG. 2 is a diagram illustrating a state in which the inside of an optical transmitter module 30 according to the present embodiment is viewed from the upper side. FIG. 3 is a sectional view of the optical transmitter module 30 according to the present embodiment. The optical transmitter module 30 according to the present embodiment is the optical transmitter module 23B illustrated in FIG. 1, for example.

The optical transmitter module 30 according to the present embodiment includes a package 101, a submount 104 having a bottom surface and a mounting surface, a Peltier element 110 disposed to be in contact with the bottom surface of the submount 104, and semiconductor lasers 200 (four semiconductor lasers in the present embodiment) mounted on the mounting surface of the submount 104. The optical transmitter module 30 further includes a collimator lens 102 and a beam splitter 103 (optical de-multiplexer) mounted on the mounting surface of the submount 104, wirings 105 (eight wirings in the present embodiment), a feedthrough 106, an optical multiplexer 107, a condenser lens 108, a receptacle terminal 109, and light receiving elements 300 (four light receiving elements in the present embodiment). The optical transmitter module 30 may be a CAN type TOSA, and may be a box type optical transmitter module. The submount 104 has a plate shape in which the bottom surface and the mounting surface face each other, but is not limited thereto, and may have, an L shape. Where the submount 104 has an L shape, a surface in contact with a Peltier element is a bottom surface. Where, a bottom surface does not face a mounting surface, but a heat movement path is the same as where the bottom surface faces the mounting surface. In other words, a large amount of heat moves between the surface (mounting surface) on which the semiconductor lasers are mounted and the surface (bottom surface) on which the submount is in contact with the Peltier element.

In the optical transmitter module 30 according to the present embodiment, the bottom surface of the submount 104 is physically in contact with the Peltier element 110 and is thermally connected thereto. The plurality of semiconductor lasers 200 are thermally connected to the submount 104. Therefore, the Peltier element 110 can be used to collectively adjust the temperatures of the plurality of semiconductor lasers 200 via the submount 104. Herein, where the optical transmitter module 30 is driven at a predefined drive temperature, temperature adjustment is performed by using the Peltier element 110 such that the submount 104 is maintained at the predefined drive temperature (within a predefined temperature range including the drive temperature).

Here, each of the semiconductor lasers 200 (four semiconductor lasers in the present embodiment) is an EA-DFB laser in which an electro absorption (EA) modulator and a distributed feedback (DFB) laser are integrated on a semiconductor substrate in a monolithic manner. Where the optical transmitter module 30 is driven, the plurality of (four in the present embodiment) semiconductor lasers 200 are required to respectively emit light beams with predefined wavelengths which are different from each other. The DFB laser is driven at a current of 70 mA and a voltage of 1.3 V (power of 0.091 W), and the EA modulator is driven at a current of 15 mA, a central bias of −0.7V, and a built-in voltage of 0.95 V (power of 0.025 W). An optical output of the semiconductor lasers 200 is 2 mW, and a heating value of a termination resistor is as follows. A resistance value of the termination resistor is 50Ω; a photocurrent in an ON state (a light transmission state in which a high voltage is applied as a bias voltage) in the EA modulator is 7.35 mA; a photocurrent in an OFF state (light blocking state in which a low voltage is applied as a bias voltage) is −14 mA; a photocurrent AC peak value is 3.325 mA; and power consumption is 0.00055 W. Therefore, in this case, a total of heating values of the semiconductor lasers 200 is about 0.117 W.

Among the semiconductor lasers 200 (four semiconductor lasers in the present embodiment), the semiconductor laser 200 located on the lower part in FIG. 2 is referred to as a first semiconductor laser 200A, and the remaining three semiconductor lasers 200 are referred to as second semiconductor lasers 200B. A main feature of the optical transmitter module 30 according to the present embodiment is that there is provided a first sub-substrate (not illustrated) which is disposed between the first semiconductor laser 200A and the Peltier element 110 and hinders transfer of heat emitted from the first semiconductor laser 200A. Details of such a configuration will be described later.

Each of the semiconductor lasers 200 (four semiconductor lasers in the present embodiment) is electrically connected to the feedthrough 106 via a plurality of wires 105A. Each of the light receiving elements 300 (four light receiving elements in the present embodiment) is electrically connected to the feedthrough 106 via a plurality of wires 105B. The plurality of semiconductor lasers 200 are stored to be arranged side by side in the package 101, and each of the plurality of semiconductor lasers 200 emits light L with a predefined wavelength. The light L emitted from each of the plurality of semiconductor lasers 200 is emitted in the same direction. For simplification, in FIGS. 2 and 3, a single wire 105A and a single wire 105B are respectively illustrated as the plurality of wires 105A and the plurality of wires 105B.

The light L emitted from each of the plurality of semiconductor lasers 200 through space transmission inside the package 101 passes through the collimator lens 102 provided in a direction in which the light L is emitted, and is thus converted into parallel light. As illustrated in FIGS. 2 and 3, the collimator lens 102 may be a microlens array in which a plurality of lenses are arranged side by side and are connected to each other.

The light L converted into the parallel light is then incident to the beam splitter 103 so as to branch into transmitted light Lt and branch light Lb at a predetermined ratio. In other words, the beam splitter 103 emits the transmitted light Lt in an optical axis direction (the light emission direction of the semiconductor laser 200), and emits the branch light Lb in a direction perpendicular to the optical axis. Here, the branch light Lb is emitted upward in FIG. 3 by the beam splitter 103.

A branch light beams (four branch light beams in the present embodiment) Lb emitted upward by the beam splitter 103 are incident to a light reception surface 301 of each of the light receiving elements 300 (four light receiving elements in the present embodiment). As illustrated in FIG. 3, each of the plurality of light receiving elements 300 is disposed on the beam splitter 103, and the light reception surface 301 of each of the plurality of light receiving elements 300 faces the beam splitter 103. Here, the light receiving element 300 is, for example, a photodiode. The light receiving element 300 monitors an optical output of the semiconductor laser 200. The optical output of the semiconductor laser 200 is controlled to be constant on the basis of a monitoring result.

The transmitted light Lt which is transmitted through the beam splitter 103 as a part of the light emitted from the semiconductor laser 200 is incident to the optical multiplexer 107 which multiplexes light, and then the light is multiplexed in the optical multiplexer 107 so as to be output as light Lout which is transmitted to the outside. The light Lout emitted from the optical multiplexer 107 is then collected in the condenser lens 108, and is incident to the receptacle terminal 109 which is connected to a receptor. The receptacle terminal 109 is optically connected to an external optical fiber (not illustrated), and light output from the receptacle terminal 109 is transmitted through the optical fiber.

The inside of the package 101 of the optical transmitter module 30 may be in a vacuum state, and may be filled with an inert gas (for example, a nitrogen gas), a dry air, or the like. Where the inside of the package 101 is filled with an inert gas as mentioned above, the reliability of the optical transmitter module 30 can be increased.

Figure 4:
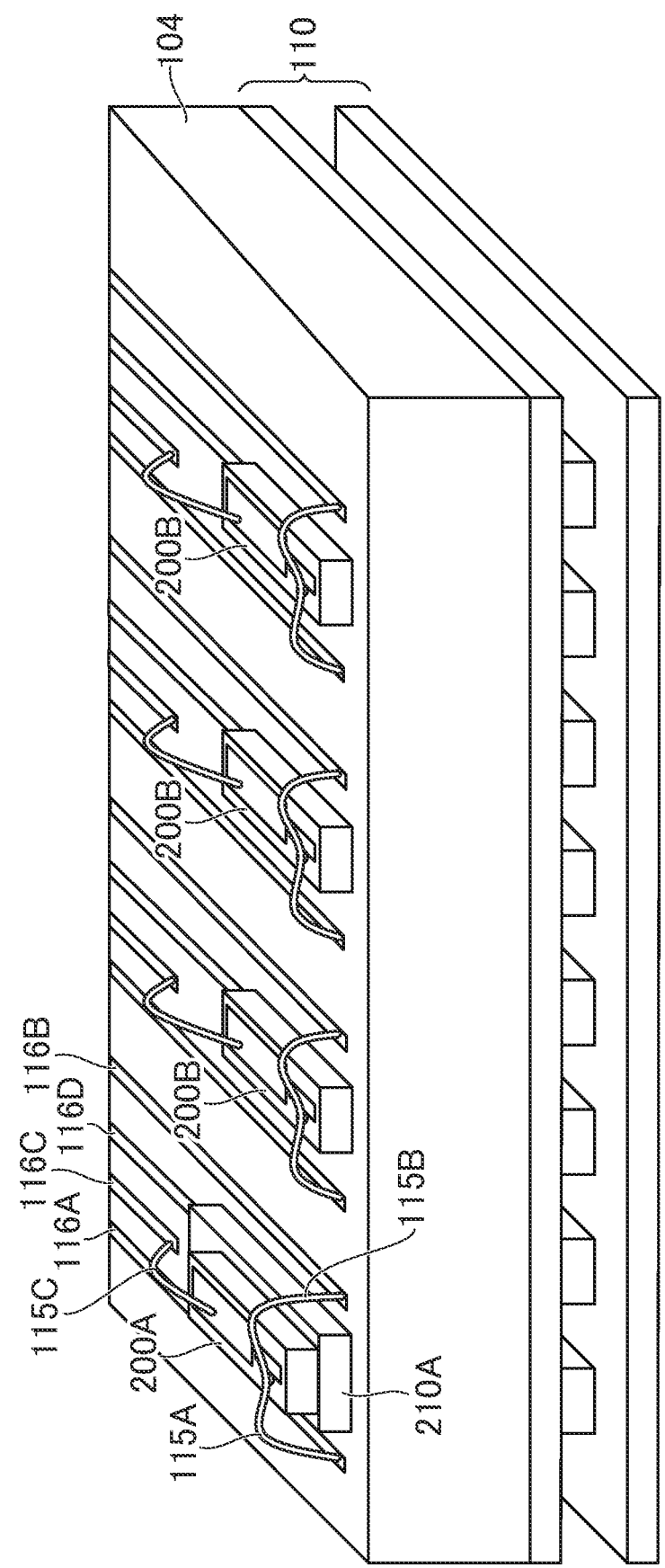
FIG. 4 is a schematic diagram illustrating a part of the optical transmitter module according to the first embodiment of the present invention.

FIG. 4 is a schematic diagram illustrating a part of the optical transmitter module 30 according to the present embodiment. In FIG. 4, the semiconductor lasers 200 (four semiconductor lasers in the present embodiment) arranged in a first direction (a horizontal direction in FIG. 4) are mounted on the mounting surface of the submount 104. Among the four semiconductor lasers 200, the (three) second semiconductor lasers 200B are directly mounted on the mounting surface of the submount 104, whereas the first semiconductor laser 200A is mounted on the mounting surface of the submount 104 via a first sub-substrate 210A. In other words, the first sub-substrate 210A is disposed between the first semiconductor laser 200A and the submount 104, and is thermally connected to both of the two.

In the present specification, a case where the semiconductor lasers 200 are mounted on the submount 104 includes a case where the semiconductor laser 200 is physically in contact with the mounting surface of the submount 104 and is directly mounted thereon, and a case where a thermal resistor is disposed to be physically in contact with the mounting surface of the submount 104, and the semiconductor laser 200 is physically in contact with the thermal resistor so as to be mounted, that is, indirectly mounted.

Wiring patterns 116 connected to a plurality of electrodes of the mounted semiconductor lasers 200 are formed on the mounting surface of the submount 104. The plurality of wiring patterns 116 are respectively connected to the plurality of electrodes via wires 115. The semiconductor laser 200 includes an EA modulator portion and a DFB laser portion. A pair of EA electrodes of the EA modulator portion are electrically connected to a pair of wiring patterns 116A and 116B via a pair of wires 115A and 115B, respectively. One of a pair of DFB electrodes of the DFB laser portion is electrically connected to a wiring pattern 116C via a wire 115C. The other electrode is disposed on the bottom surface side of the semiconductor laser 200, and is electrically connected to a corresponding electrode pattern 116D. The other DFB electrode of the first semiconductor laser 200A is electrically connected to the corresponding electrode pattern 116D through a via hole (not illustrated) provided in the first sub-substrate 210A. However, the connection there between is not limited thereto, and may be realized, for example, according to a method of metalizing a side surface of the first sub-substrate 210A. In the present embodiment, a material of the submount is aluminum nitride.

Here, the first sub-substrate 210A is a thermal resistor (first thermal resistor) hindering transfer of heat emitted from the first semiconductor laser 200A when the Peltier element 110 is driven. Thermal connection between each of the semiconductor lasers 200 and the submount 104 is sufficiently ensured through heat conduction. Therefore, where the first sub-substrate 210A (first thermal resistor) is disposed between the first semiconductor laser 200A and the submount 104, the first sub-substrate 210A functions as a thermal resistor which has high thermal resistance and reduces heat dissipation.

Where the optical transmitter module 30 is driven, the submount 104 is controlled at a predefined drive temperature (a predefined temperature range including the drive temperature) by using the Peltier element 110. Each of the plurality of semiconductor lasers 200 is required to emit a light beam with a predefined wavelength at the predefined drive temperature. Therefore, at a reference temperature, each output wavelength of each light beam emitted from each of the semiconductor lasers 200 is required to fall within a reference wavelength range. Here, for simplification, it is assumed that a drive temperature is the same as a reference temperature as 50° C.

In the embodiment, an output wavelength of a light beam emitted from the first semiconductor laser 200A at the reference temperature does not fall within the corresponding reference wavelength range, and is shorter than the wavelength range. In contrast, an output wavelength of each light beam emitted from each of the three second semiconductor lasers 200B at the reference temperature falls within the corresponding reference wavelength range.

Each second semiconductor laser 200B is directly mounted on the mounting surface of the submount 104, and, where the submount 104 is maintained at the drive temperature by using the Peltier element 110, each second semiconductor laser 200B is maintained at the drive temperature (and the predefined temperature range). Therefore, each second semiconductor laser 200B can emit a light beam with the predefined wavelength (the predefined wavelength range including the wavelength) at the drive temperature.

In contrast, if the first sub-substrate 210A is not disposed, and the first semiconductor laser 200A is directly mounted on the mounting surface of the submount 104, the first semiconductor laser 200A emits a light beam with a first wavelength which is different from the predefined wavelength (the predefined wavelength range including the wavelength) at the drive temperature. However, in the optical transmitter module 30 according to the present embodiment, the first sub-substrate 210A is disposed between the first semiconductor laser 200A and the submount 104. Thus, the first sub-substrate 210A functions as a thermal resistor, and the semiconductor laser 200A is in a state in which heat dissipation is reduced compared with the semiconductor lasers 200B. Specifically, outflow paths of heat from the semiconductor laser 200 which is a heat generation body includes a path along which heat is transferred to the submount 104 via the mounting surface, a path along which heat is transferred to the submount 104 via the plurality of wires 115, and a path along which heat is emitted through heat radiation where the package inside is filled with a gas. Among the paths, an amount of heat based on heat radiation to the ambient gas is sufficiently smaller than an amount of heat based on heat conduction to the submount 104, and thus a large amount of heat from the semiconductor lasers is transferred to the submount 104. The submount 104 is maintained at the drive temperature by using the Peltier element 110, and the temperature of the second semiconductor laser 200B directly mounted on the submount 104 is substantially the same as the temperature of the mounting surface of the submount. Strictly speaking, the temperature of the second semiconductor laser 200B is higher by a thermal resistance of the contact portion (generally, connection using soldering) between the submount 104 and the second semiconductor laser 200B, but, herein, for simplification of description, the contact resistance is ignored, and the temperature of the mounting surface of the submount 104 is assumed to be the same as the temperature of the second semiconductor laser 200B. In contrast, the semiconductor laser 200A is physically and thermally connected to the submount 104 via the first sub-substrate 210A which is a thermal resistor. The first sub-substrate 210A is a thermal resistor, and thus reduces heat conduction to the submount 104 of heat generated from the semiconductor laser 200A (reduction in heat dissipation). As a result, a thermal equilibrium state occurs in a state in which the temperature of the semiconductor laser 200A is substantially the same as that of the connection surface with the first sub-substrate 210A (as described above, the contact resistance is ignored), and the temperature of the connection surface between the first sub-substrate 210A and the semiconductor laser 200A is higher than the temperature of the connection surface with the submount 104.

Therefore, the temperature of the first semiconductor laser 200A is higher than the drive temperature, and an output wavelength of a light beam emitted from the first semiconductor laser 200A is shifted to a longer wavelength side than an output wavelength where the first semiconductor laser 200A is driven at the drive temperature. The first sub-substrate 210A is formed by selecting an appropriate material or dimension, and thus an output wavelength of a light beam emitted from the first semiconductor laser 200A can be made come closer to the predefined wavelength than the first wavelength. More preferably, an output wavelength of a light output from the first semiconductor laser 200A can be made the predefined wavelength. For simplification of description, the description has been made assuming that the temperature of the semiconductor laser 200 does not have a distribution. Strictly, a heat distribution is present even in the inside of the semiconductor laser 200, but, herein, has not been described in order to describe the effect of the first sub-substrate 210A.

Herein, a reference temperature and a drive temperature are the same as each other, but are not limited thereto. An output wavelength of a light beam emitted from the semiconductor laser 200 depends on a temperature. Therefore, a predefined wavelength required for each semiconductor laser 200 at a drive temperature is determined depending on a reference wavelength range corresponding to each semiconductor laser 200 at a reference temperature, and a temperature difference between a drive temperature and a reference temperature.

FIG. 5 is a diagram illustrating characteristics of a thermal resistor for ceramic materials. Here, it is assumed that, as dimensions of the first sub-substrate 210A, a width is 300 µm, a length is 600 µm, and a height is 100 µm. Where a thermal resistor is formed according to such dimensions by using materials illustrated in FIG. 5, heat conductivity (W/mK) of the materials, a temperature difference (K) caused by the thermal resistor, and a difference in an output wavelength of a light beam emitted from the semiconductor laser 200 are illustrated.

A method of manufacturing the first sub-substrate 210A of the optical transmitter module 30 according to the present embodiment is as follows. The first semiconductor laser 200A is manufactured according to a well-known method. After the first semiconductor laser 200A is manufactured, an output wavelength of a light beam emitted from the first semiconductor laser 200A is measured at a reference temperature. The measured output wavelength is compared with a reference wavelength range corresponding to the first semiconductor laser 200A such that a wavelength difference is obtained. Specifically, a wavelength difference between the measured output wavelength and a central value of the reference wavelength range corresponding to the first semiconductor laser 200A is computed. Where a reference temperature is the same as the drive temperature, a material and dimensions of the first sub-substrate 210A are determined according to the wavelength difference. Where the first sub-substrate 210A is formed according to the dimensions illustrated in FIG. 5, a temperature difference for complementing the wavelength difference may be calculated, and a material or dimensions capable of causing the temperature difference may be determined. Where the wavelength difference is 0.16 nm, the first sub-substrate 210A is preferably formed by using alumina ($Al_2O_3$). In DWDM based on the CFP system standard, since a wavelength difference between output wavelengths adjacent to each other is about 4.5 nm, the first sub-substrate 210A is formed by using the representative ceramic materials illustrated in FIG. 5, and thus an output wavelength of a light beam emitted from the first semiconductor laser 200A can be made sufficiently close to a predefined wavelength. Where a reference temperature is different from a drive temperature, a temperature at which the first semiconductor laser 200A can emit a light beam with a predefined wavelength may be calculated according to a wavelength difference on the basis of the drive temperature of the Peltier element 110, and a material or dimensions capable of causing a temperature difference may be determined. Generally, a material having high heat dissipation (a material having high heat conductivity, and, for example, aluminum nitride) is used for the submount 104. In contrast, the first sub-substrate 210A is formed by using a material having lower heat conductivity than that of the submount, and dimensions thereof are smaller than those of the submount, so that thermal resistance can be increased. Thus, a temperature difference between the first semiconductor laser 200A and the mounting surface of the submount 104 can be increased. The submount 104 and the first sub-substrate 210A may be made of the same material, but different materials are preferably used in order to obtain a greater temperature difference.

The optical transmitter module 30 according to the present embodiment includes the first sub-substrate 210A. If the first semiconductor laser 200A is directly mounted on the mounting surface of the submount 104 without using the first sub-substrate 210A, the first semiconductor laser 200A cannot be used at a drive temperature. Therefore, the first semiconductor laser 200A is discarded, and thus a yield is reduced. Since the first sub-substrate 210A is disposed on the submount 104, the first semiconductor laser 200A can be driven at a temperature (higher than a drive temperature) which is different from the drive temperature, and thus the first semiconductor laser 200A can be used for the optical transmitter module 30. Since the thermal resistor is disposed, an effective drive temperature of the semiconductor laser can be adjusted instead of performing temperature adjustment by using an individual Peltier element, and thus it is possible to adjust an available wavelength range of the semiconductor laser. The semiconductor lasers can be driven by using a single Peltier element, and thus it is possible to realize miniaturization and low power consumption. A wavelength range specification of the semiconductor laser can be expanded, and thus a yield of the semiconductor laser can be improved. The first sub-substrate 210A (thermal resistor) used in the present embodiment does not generate heat. For example, even where a heater is used instead of the first sub-substrate 210A, a wavelength range can be adjusted. However, in a case of the heater, a wiring, a power source, and the like for driving the heater are necessary, and thus it is hard to provide an optical transmitter module satisfying miniaturization and low cost. According to the present invention, it is possible to individually adjust a wavelength of the semiconductor laser by using a simple ceramic substrate or the like.

Second Embodiment

Figure 6:
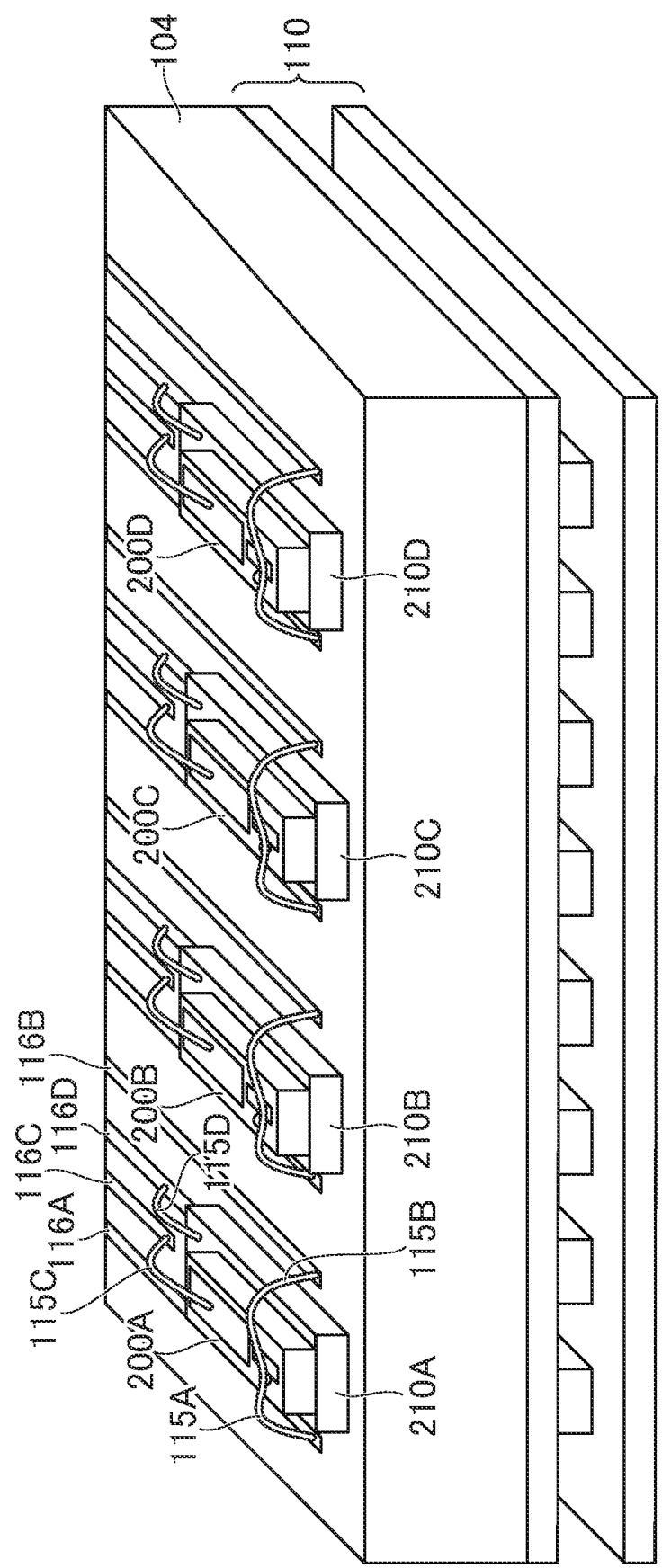
FIG. 6 is a schematic diagram illustrating a part of an optical transmitter module according to a second embodiment of the present invention.

FIG. 6 is a schematic diagram illustrating a part of an optical transmitter module 30 according to a second embodiment of the present invention. Apart of the optical transmitter module 30 illustrated in FIG. 6 corresponds to a part of the optical transmitter module 30 according to the first embodiment illustrated in FIG. 4. The optical transmitter module 30 according to the present embodiment has the same structure as that in the first embodiment except for configurations of semiconductor lasers 200 (four semiconductor lasers in the present embodiment) and sub-substrates 210 (four sub-substrates in the present embodiment) (thermal resistors) disposed on the mounting surface of the submount 104. The four semiconductor lasers 200 mounted on the submount 104 according to the present embodiment are a first semiconductor laser 200A, a second semiconductor laser 200B, a third semiconductor laser 200C, and a fourth semiconductor laser 200D, and the sub-substrate 210 is disposed between each semiconductor laser 200 and the submount 104. In other words, a first sub-substrate 210A, a second sub-substrate 210B, a third sub-substrate 210C, and a fourth sub-substrate 210D are respectively disposed between the submount 104 and the four semiconductor lasers 200. Herein, the sub-substrates 210 (four in the present embodiment) have the substantially same dimensions. Regarding materials, materials of the first sub-substrate 210A and the third sub-substrate 210C are the same as each other, and materials of the second sub-substrate 210B and the fourth sub-substrate 210D are the same as each other.

The second semiconductor laser 200B is different from the first semiconductor laser 200A, and preferably emits a light beam with a wavelength which is different from an output wavelength of a light beam emitted from the first semiconductor laser 200A when the optical transmitter module 30 is driven. In the same manner as the first semiconductor laser 200A, an output wavelength of a light beam emitted from the second semiconductor laser 200B at a reference temperature does not fall within a corresponding reference wavelength range, and is shorter than the wavelength range. The second sub-substrate 210B is a thermal resistor (second thermal resistor) for causing a temperature difference from the mounting surface of the submount 104 in the second semiconductor laser 200B when the Peltier element 110 is driven. In the present embodiment, the second semiconductor laser 200B is the same for the third semiconductor laser 200C and the fourth semiconductor laser 200D, and the second sub-substrate 210B is the same for the third sub-substrate 210C and the fourth sub-substrate 210D.

The four semiconductor lasers 200 are respectively maintained at temperatures higher than a drive temperature at which the submount 104 is maintained by the corresponding sub-substrates 210 when the Peltier element 110 is driven. Each sub-substrate 210 is formed by selecting an appropriate material or dimension, and thus an output wavelength of a light beam emitted from the first semiconductor laser 200 can be made to come closer to a predefined wavelength than an output wavelength at a drive temperature. An output wavelength of the second semiconductor laser 200B at the drive temperature is a second wavelength. More preferably, an output wavelength of a light output from each semiconductor laser 200 can be made the predefined wavelength.

A material or dimensions of each of the sub-substrates 210 may be selected according to characteristics of the corresponding semiconductor laser 200, but, among the semiconductor lasers 200 (four in the present embodiment), materials or/and dimensions of two sub-substrates 210 disposed under at least two semiconductor lasers 200 are preferably different from each other. If materials and dimensions of the sub-substrates 210 (four sub-substrates in the present embodiment) are the same as each other, the significance of disposing the sub-substrates 210 is reduced, and thus the submount 104 may be maintained at a higher temperature by using the Peltier element 110 instead of disposing the sub-substrates 210.

The four sub-substrates 210 are respectively disposed between all of the four semiconductor lasers 200 mounted on the submount 104 according to the present embodiment and the submount 104. Here, the four sub-substrates 210 are manufactured according to common dimensions. At least thicknesses of all of the four sub-substrates 210 are preferably substantially the same as each other. Where the optical transmitter module 30 has such a configuration, heights of light emission locations (light emission central points) in the four semiconductor lasers 200 manufactured to have a common structure are substantially the same as each other. In the optical transmitter module 30 according to the present embodiment, a microlens array having four collimator lenses 102 can be used, and thus an optical axis can be easily adjusted by using a plurality of lenses.

In the present embodiment, unlike the first embodiment, a plurality of electrodes of the semiconductor lasers 200 and a plurality of electrode patterns 116 formed on the mounting surface of the submount 104 are respectively electrically connected to each other via wires 115 (four wires in the present embodiment). Unlike the first embodiment, a via hole is not provided in the sub-substrate 210, and thus a greater temperature difference using large thermal resistance can be realized. A pair of EA electrodes of the EA modulator portion of the semiconductor laser 200 are electrically connected to a pair of wiring patterns 116A and 116B via a pair of wires 115A and 115B, respectively. A pair of laser electrodes of the DFB laser portion of the semiconductor laser 200 are electrically connected to the pair of wiring patterns 116C and 116D via the pair of wires 115C and 115D.

In the present embodiment, the four sub-substrates 210 are respectively disposed between the four semiconductor lasers 200 and the mounting surface of the submount 104. Since the four sub-substrates 210 are disposed, an optical axis is easily adjusted by using a plurality of lenses, but the present invention is not limited thereto. Unlike the first embodiment, the first sub-substrate 210A and the second sub-substrate 210B are respectively disposed for the first semiconductor laser 200A and the second semiconductor laser 200B, so that two sub-substrates 210 are disposed according to the respective two semiconductor lasers 200, and thus the optical transmitter module 30 can be configured according to characteristics of the first semiconductor laser 200A and the second semiconductor laser 200B.

Third Embodiment

Figure 7:
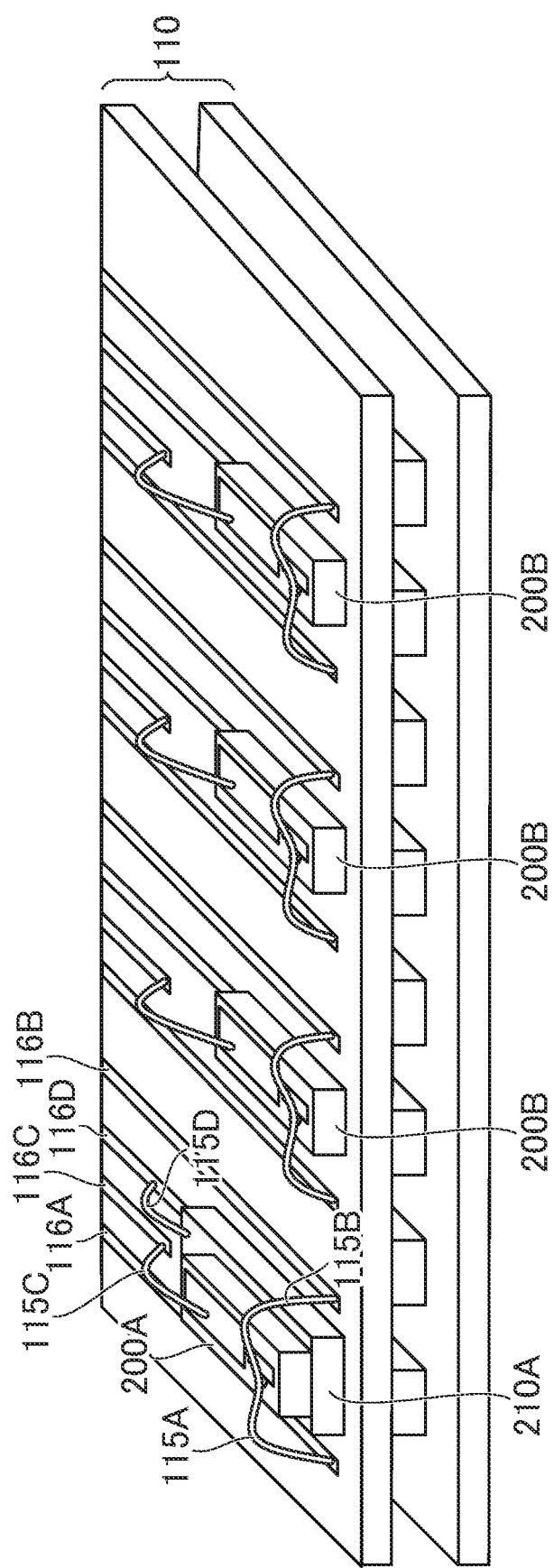
FIG. 7 is a schematic diagram illustrating a part of an optical transmitter module according to a third embodiment of the present invention.

FIG. 7 is a schematic diagram illustrating a part of an optical transmitter module 30 according to a third embodiment of the present invention. A part of the optical transmitter module 30 illustrated in FIG. 7 corresponds to a part of the optical transmitter module 30 according to the first embodiment illustrated in FIG. 4. The optical transmitter module 30 according to the present embodiment has the same structure as that in the first embodiment except that the submount 104 is not provided, and semiconductor lasers 200 are mounted on the Peltier element 110.

As illustrated in FIG. 7, the optical transmitter module 30 according to the present embodiment does not include the submount 104, and semiconductor lasers 200 are mounted on the Peltier element 110. The Peltier element 110 has a mounting surface, and a first sub-substrate 210A is disposed between the first semiconductor laser 200A and the Peltier element 110. Among the semiconductor lasers 200, three semiconductor lasers 200 other than the first semiconductor laser 200A are second semiconductor lasers 200B, and the three second semiconductor lasers 200B are directly mounted on the Peltier element 110.

Wiring patterns 116 electrically connected to the mounted semiconductor lasers 200 are formed on the mounting surface of the Peltier element 110 according to the present embodiment. The wiring patterns 116 connected to the first semiconductor laser 200A are the same as the wiring patterns 116 (refer to FIG. 6) according to the second embodiment formed on the mounting surface of the submount 104, and the wiring patterns 116 respectively connected to the three second semiconductor lasers 200B are the same as the wiring patterns 116 (refer to FIG. 4) according to the first embodiment formed on the mounting surface of the submount 104.

Fourth Embodiment

Figure 8:
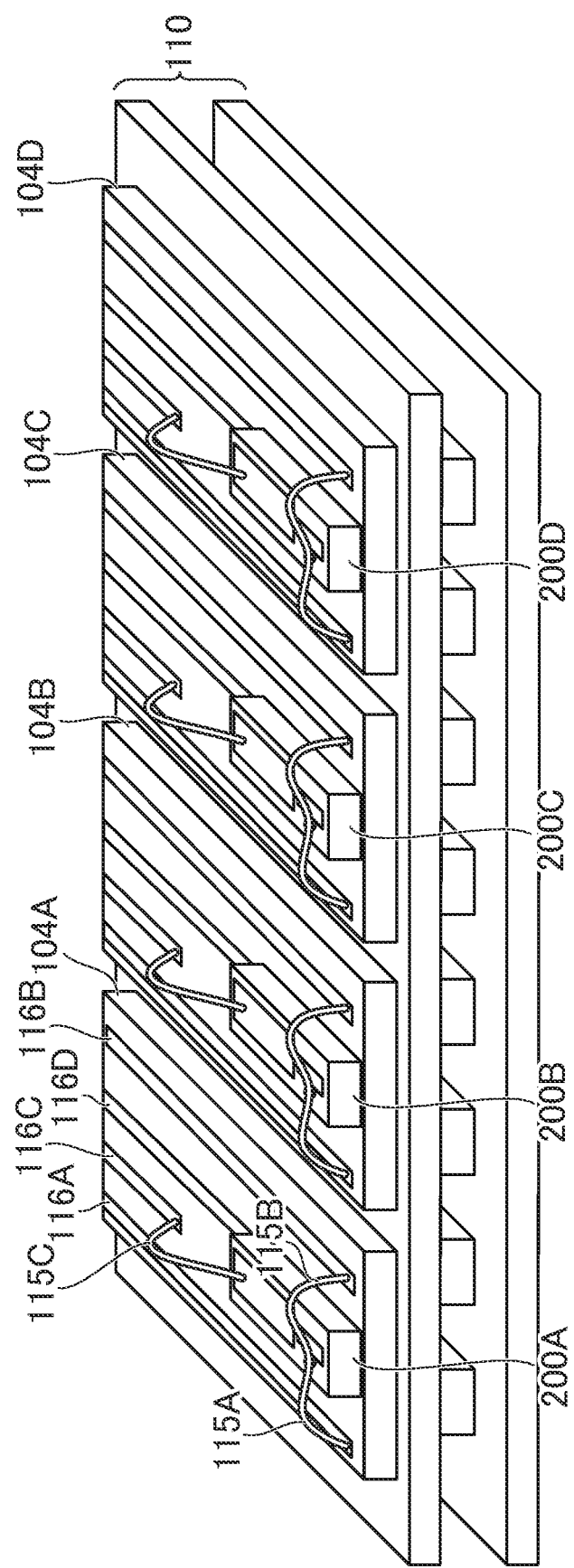
FIG. 8 is a schematic diagram illustrating a part of the optical transmitter module according to the third embodiment of the present invention.

FIG. 8 is a schematic diagram illustrating a part of an optical transmitter module 30 according to a fourth embodiment of the present invention. A part of the optical transmitter module 30 illustrated in FIG. 8 corresponds to a part of the optical transmitter module 30 according to the second embodiment illustrated in FIG. 6. The optical transmitter module 30 according to the present embodiment includes a submounts 104 on which semiconductor lasers 200 are respectively mounted. Here, a first submount 104A disposed between the first semiconductor laser 200A and the Peltier element 110 is a first thermal resistor, and a second submount 104B disposed between the second semiconductor laser 200B and the Peltier element 110 is a second thermal resistor. This is also the same for a third submount 104C and a fourth submount 104D.

Wiring patterns 116 electrically connected to the semiconductor lasers 200 are formed on mounting surfaces of the submounts 104 according to the present embodiment, but the respective wiring patterns 116 are the same as the wiring patterns 116 (refer to FIG. 4) according to the first embodiment formed on the mounting surface of the submount 104.

As mentioned above, the submount, the optical transmitter module, and the optical module, and the control method therefor according to the embodiments of the present invention have been described. In the embodiments, an optical semiconductor device is a semiconductor laser, but is not limited thereto, and the embodiments are widely applicable to other optical semiconductor devices such as a photodiode (PD) device. In the embodiments, a semiconductor laser is an EA-DFB laser, but is not limited thereto, and the present invention is widely applicable to other semiconductor lasers such as a CW light source and a direct-modulation semiconductor laser. The optical transmitter module according to the embodiments includes four semiconductor lasers of the CFP system, but is not limited thereto, and the optical transmitter module may include, for example, eight semiconductor lasers. In the embodiments, a single Peltier element is used as a single piece of temperature adjustment means, but this is only an example, and other temperature adjustment mechanisms may be used. The present invention is widely applicable to an optical transmitter module achieving the effects of the present invention.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical transmitter module comprising:
a plurality of optical semiconductor devices;
a temperature adjustment means for performing temperature adjustment collectively on the plurality of optical semiconductor devices; and
a plurality of thermal resistors that are physically separated from one another,
  each thermal resistor, of the plurality of thermal resistors, being disposed between a respective optical semiconductor device, of the plurality of optical semiconductor devices, and the temperature adjustment means,
wherein, the plurality of thermal resistors are mounted on a submount, and
  wherein, when the temperature adjustment means is driven, a first thermal resistor, of the plurality of thermal resistors, reduces dissipation of heat generated from a first optical semiconductor device such that the temperature adjustment means causes a temperature of the first optical semiconductor device to be higher than a temperature of a second optical semiconductor device of the plurality of optical semiconductor devices.

2. The optical transmitter module according to claim 1, wherein the first optical semiconductor device emits one light beam with a first wavelength which is different from a first predefined wavelength at a driving temperature which is controlled by the temperature adjustment means, and
wherein, when the temperature adjustment means is driven, the first thermal resistor shifts a wavelength of another light beam emitted from the first optical semiconductor device from the first wavelength closer to the first predefined wavelength.

3. The optical transmitter module according to claim 1, wherein the submount, on which the plurality of optical semiconductor devices are mounted, is arranged to thermally connect to the temperature adjustment means,
  wherein the first thermal resistor, of the plurality of thermal resistors, is a first sub-substrate disposed between the first optical semiconductor device and the submount in thermal communication with the first optical semiconductor device and the submount.

4. The optical transmitter module according to claim 3, wherein
  a second thermal resistor, of the plurality of thermal resistors, is a second sub-substrate, disposed between the second optical semiconductor device and the submount in thermal communication with the second optical semiconductor device and the submount configured to cause a temperature of the second optical semiconductor device to be different from the temperature of the first optical semiconductor device when the temperature adjustment means is driven, wherein the second optical semiconductor device is different from the first optical semiconductor device.

5. The optical transmitter module according to claim 4, wherein the second optical semiconductor device emits one light beam with a second wavelength which is different from a second predefined wavelength in a temperature range controlled by the temperature adjustment means, and
wherein, when the temperature adjustment means is driven, the second sub-substrate shifts a wavelength of another light beam emitted from the second optical semiconductor device from the second wavelength closer to the second predefined wavelength.

6. The optical transmitter module according to claim 4, wherein thermal resistance of the first sub-substrate between the submount and the first optical semiconductor device is different from thermal resistance of the second sub-substrate between the submount and the second optical semiconductor device.

7. The optical transmitter module according to claim 3, wherein the plurality of thermal resistors are sub-substrates, each disposed between a corresponding optical semiconductor device of the plurality of optical semiconductor devices and the submount in thermal communication with the corresponding optical semiconductor device and the submount, configured to cause temperatures of at least two of the plurality of optical semiconductor devices to be different from each other when the temperature adjustment means is driven.

8. The optical transmitter module according to claim 7, wherein thicknesses of the sub-substrates are substantially the same.

9. The optical transmitter module according to claim 3, wherein heat conductivity of a material forming the first sub-substrate is lower than heat conductivity of a material forming the submount.

10. The optical transmitter module according to claim 3, wherein dimensions of the first sub-substrate are smaller than dimensions of the submount.

11. An optical module comprising:
the optical transmitter module according to claim 1; and
an optical receiver module.

12. Optical transmission equipment mounted with the optical module according to claim 11.

13. A method of manufacturing an optical transmitter module comprising optical semiconductor devices, a temperature adjustment means for performing temperature adjustment collectively on the optical semiconductor devices, and thermal resistors that are physically separated from one another, each thermal resistor of the thermal resistors being disposed between a respective optical semiconductor device of the optical semiconductor devices and the temperature adjustment means, the method comprising:
  manufacturing a first optical semiconductor device of the optical semiconductor devices;
  measuring an output wavelength of a light beam emitted from the first optical semiconductor device at a reference temperature;
  comparing the output wavelength with a reference wavelength range corresponding to the first optical semiconductor device so as to obtain a wavelength difference; and
  determining a material and dimensions of a first thermal resistor, of the thermal resistors and associated with the first optical semiconductor device, on the basis of the wavelength difference.

14. The method according to claim 13, wherein comparing the output wavelength with a reference wavelength range corresponding to the first optical semiconductor device includes:
   comparing the output wavelength and a central value of the reference wavelength range.

15. The method according to claim 13, wherein the material is determined to be formed using alumina when the wavelength difference is 0.16 nm.

* * * * *